(12) United States Patent
Satake (10) Patent No.: US 9,979,347 B2
(45) Date of Patent: May 22, 2018

(54) MANAGEMENT SYSTEM, MANAGEMENT METHOD, CONTROL APPARATUS, AND PHOTOVOLTAIC CELL APPARATUS

(71) Applicant: KYOCERA CORPORATION, Kyoto (JP)

(72) Inventor: Masaomi Satake, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 136 days.

(21) Appl. No.: 14/420,186

(22) PCT Filed: Aug. 6, 2013

(86) PCT No.: PCT/JP2013/071226
§ 371 (c)(1),
(2) Date: Feb. 6, 2015

(87) PCT Pub. No.: WO2014/024871
PCT Pub. Date: Feb. 13, 2014

(65) Prior Publication Data
US 2015/0229268 A1 Aug. 13, 2015

(30) Foreign Application Priority Data
Aug. 6, 2012 (JP) .................. 2012-174459

(51) Int. Cl.
*H01L 31/00* (2006.01)
*H02S 50/10* (2014.01)
*H01L 31/02* (2006.01)
*H02J 13/00* (2006.01)
*H02S 40/32* (2014.01)
*H02S 40/34* (2014.01)

(52) U.S. Cl.
CPC ........ *H02S 50/10* (2014.12); *H01L 31/02021* (2013.01); *H02J 13/001* (2013.01); *H02J 13/0086* (2013.01); *H02S 40/32* (2014.12); *H02S 40/34* (2014.12); *Y02B 10/14* (2013.01); *Y02E 10/50* (2013.01); *Y02E 40/72* (2013.01); *Y02P 80/23* (2015.11); *Y04S 10/123* (2013.01); *Y04S 10/40* (2013.01)

(58) Field of Classification Search
None
See application file for complete search history.

(56) References Cited

U.S. PATENT DOCUMENTS

2011/0264289 A1 10/2011 Sawyer et al.

FOREIGN PATENT DOCUMENTS

| JP | H10-073440 A | 3/1998 |
|---|---|---|
| JP | 2002-152976 A | 5/2002 |
| JP | 2006-048105 A | 2/2006 |
| JP | 2006-290209 A | 10/2006 |

(Continued)

OTHER PUBLICATIONS

Extended European Search Report dated Mar. 15, 2016 issued by the European Patent Office for Counterpart European Application No. EP 13827673.8.

(Continued)

*Primary Examiner* — Shannon Gardner
(74) *Attorney, Agent, or Firm* — Procopio Cory Hargreaves and Savitch LLP (57) ABSTRACT

At least one of a message indicating a spec of a PV apparatus (130) and a message indicating a status of the PV apparatus (130) is standardized between an EMS (200) and the PV apparatus (130).

5 Claims, 8 Drawing Sheets

----- POWER LINE
------ SIGNAL LINE

(56) References Cited

FOREIGN PATENT DOCUMENTS

| JP | 2008-253002 A | 10/2008 |
|---|---|---|
| JP | 2010-128810 A | 6/2010 |
| JP | 2013-90455 A | 5/2013 |
| WO | 2006-078685 A2 | 7/2006 |
| WO | 2010/140664 A1 | 12/2010 |

OTHER PUBLICATIONS

Office Action dated Mar. 7, 2017 issued by the Japan Patent Office for counterpart Japanese Application No. 2016-135457 with Concise Explanation, 5 pages.
Article 94(3) EPC issued on Apr. 6, 2017 by the European Patent Office in counterpart European Patent Application No. 13 827 673.8, 7 pages.
Office Action dated Aug. 25, 2015, issued in counterpart Japanese application No. 2012-174459.
International Search Report; PCT/JP2013/071226; dated Sep. 3, 2013.
Office Action dated Dec. 15, 2015, issued in counterpart Japanese application No. 2012-174459.
New communication standard "ECHONET Lite" that is the core of the smart house construction becomes the standard interface of the HEMS, Downloaded Dec. 3, 2015, 11 pages, http://sgforum.impress.co.jp/article/1302.
Office Action dated Jan. 9, 2018 issued in counterpart Japanese Application No. 2017-122770.

| MESSAGE TYPE (AAA) | SPEC (0000 TO X000) | |
|---|---|---|
| | RATED POWER (GRID CONNECTION STATE) | PANEL MAXIMUM OUTPUT |

OR

| RATED POWER (SELF-SUSTAINED OPERATION STATE) | PANEL MAXIMUM OUTPUT |
|---|---|

OR

| RATED POWER (GRID CONNECTION STATE) | RATED POWER (SELF-SUSTAINED OPERATION STATE) | PANEL MAXIMUM OUTPUT |
|---|---|---|

FIG. 7 and the photovoltaic cell apparatus. The management method comprises: a step of transmitting the message indicating the status of the photovoltaic cell apparatus from the control apparatus to the photovoltaic cell apparatus, or a step of transmitting at least one of the message indicating the spec of the photovoltaic cell apparatus and the message indicating the status of the photovoltaic cell apparatus, from the photovoltaic cell apparatus to the control apparatus.

MANAGEMENT SYSTEM, MANAGEMENT METHOD, CONTROL APPARATUS, AND PHOTOVOLTAIC CELL APPARATUS

TECHNICAL FIELD

The present invention relates to a management system having a photovoltaic cell apparatus which comprises a power conditioner which converts a power generated by a solar panel, and a control apparatus which communicates with the photovoltaic cell apparatus, as well as a management method, a control apparatus, and a photovoltaic cell apparatus.

BACKGROUND ART

In recent years, a power management system having a plurality of equipments, and a control apparatus which controls the plurality of equipments has been proposed (for example, Patent Literature 1). The plurality of equipments comprises, for example, household electrical appliances such as air conditioners and illumination apparatuses, and distributed power sources such as photovoltaic cells, storage batteries, and fuel power generation apparatus. The control apparatus, for example, is referred to as HEMS (Home Energy Management System), SEMS (Store Energy Management System), BEMS (Building Energy Management System), FEMS (Factory Energy Management System), and CEMS (Cluster/Community Energy Management System).

For popularizing the above-described management system, generalization of the message format between the plurality of equipments and the control apparatus is effective, and such a generalization of the message format is being tested.

CITATION LIST

Patent Literature

Patent Literature 1: Japanese Patent Application Publication No. 2010-128810.

SUMMARY OF INVENTION

The above-described generalization of the message format has only just begun, and various investigations need to be conducted with regard to the message format for appropriately controlling the equipments.

Thus, the present invention has been achieved in order to overcome the above-described problems, and an object thereof is to provide a management system, a management method, a control apparatus, and a photovoltaic cell apparatus capable of appropriately controlling equipments.

A management system according to a first feature comprises: a photovoltaic cell apparatus which comprises a solar panel and a power conditioner which converts a power generated by the solar panel; and a control apparatus which communicates with the photovoltaic cell apparatus. At least one of a message indicating a spec of the photovoltaic cell apparatus and a message indicating a status of the photovoltaic cell apparatus is standardized between the control apparatus and the photovoltaic cell apparatus.

In the first feature, the control apparatus instructs the status of the photovoltaic cell apparatus to the photovoltaic cell apparatus, by transmitting the message indicating the status of the photovoltaic cell apparatus to the photovoltaic cell apparatus.

In the first feature, the control apparatus acquires the status of the photovoltaic cell apparatus, by receiving the message indicating the status of the photovoltaic cell apparatus from the photovoltaic cell apparatus.

In the first feature, the control apparatus acquires the spec of the photovoltaic cell apparatus, by receiving the message indicating the spec of the photovoltaic cell apparatus from the photovoltaic cell apparatus.

In the first feature, before a communication of the message, the control apparatus receives a message indicating an existence or non-existence of a function of handling the message, from the photovoltaic cell apparatus.

In the first feature, the spec of the photovoltaic cell apparatus comprises at least one of: a rated power in a grid connection state in which the power conditioner is connected to a grid; a rated power in a self-sustained operation state in which the power conditioner is connected to a self-sustained terminal; and a maximum output power of the solar panel.

In the first feature, the status of the photovoltaic cell apparatus comprises at least one of whether or not the power conditioner is connected to a grid, and whether or not the power conditioner is connected to a self-sustained terminal.

A management method according to a second feature is used in a management system having: a photovoltaic cell apparatus which comprises a solar panel and a power conditioner which converts a power generated by the solar panel; and a control apparatus which communicates with the photovoltaic cell apparatus. At least one of a message indicating a spec of the photovoltaic cell apparatus and a message indicating a status of the photovoltaic cell apparatus is standardized between the control apparatus and the photovoltaic cell apparatus. The management method comprises: a step of transmitting the message indicating the status of the photovoltaic cell apparatus from the control apparatus to the photovoltaic cell apparatus, or a step of transmitting at least one of the message indicating the spec of the photovoltaic cell apparatus and the message indicating the status of the photovoltaic cell apparatus, from the photovoltaic cell apparatus to the control apparatus.

A control apparatus according to a third feature communicates with a photovoltaic cell apparatus which comprises a solar panel and a power conditioner which converts a power generated by the solar panel. At least one of a message indicating a spec of the photovoltaic cell apparatus and a message indicating a status of the photovoltaic cell apparatus is standardized between the control apparatus and the photovoltaic cell apparatus. The control apparatus comprises: a communication unit which receives at least one of the message indicating the spec of the photovoltaic cell apparatus and the message indicating the status of the photovoltaic cell apparatus, from the photovoltaic cell apparatus, or transmits the message indicating the status of the photovoltaic cell apparatus to the photovoltaic cell apparatus.

A photovoltaic cell apparatus according to a fourth feature comprises a solar panel and a power conditioner which converts a power generated by the solar panel. At least one of the message indicating the spec of the photovoltaic cell apparatus and the message indicating the status of the photovoltaic cell apparatus is standardized between the control apparatus which communicates with the photovoltaic cell apparatus, and the photovoltaic cell apparatus. The photovoltaic cell apparatus comprises: a communication unit which transmits at least one of the message indicating the spec of the photovoltaic cell apparatus and the message indicating the status of the photovoltaic cell apparatus, to the control apparatus, or receives the message indicating the status of the photovoltaic cell apparatus, from the control apparatus.

According to the present invention, it is possible to provide a management system, a management method, a control apparatus, and a photovoltaic cell apparatus capable of appropriately controlling equipments.

DESCRIPTION OF EMBODIMENTS

Hereinafter, a management system according to embodiments of the present invention will be described with reference to the drawings. In the following drawings, identical or similar components are denoted by identical or similar reference numerals.

It should be understood that the drawings are schematic only and the ratio of dimensions is not to scale. Therefore, specific dimensions should be determined with reference to the description below. It is needless to mention that different relationships and ratio of dimensions may be included in different drawings.

Outline of the Embodiments

A management system according to embodiments comprises: a photovoltaic cell apparatus which comprises a solar panel and a power conditioner which converts a power generated by the solar panel; and a control apparatus which communicates with the photovoltaic cell apparatus. At least one of a message indicating a spec of the photovoltaic cell apparatus and a message indicating a status of the photovoltaic cell apparatus is standardized between the control apparatus and the photovoltaic cell apparatus.

In the embodiments, a message indicating the spec of a photovoltaic cell apparatus, or a message indicating a status of the photovoltaic cell apparatus is standardized between the control apparatus and the photovoltaic cell apparatus. Therefore, the photovoltaic cell apparatus can be controlled appropriately by using these messages. Moreover, the other equipments (a load, a fuel cell apparatus, and a storage battery apparatus) can also be controlled appropriately by using these messages.

First Embodiment

Energy Management System

Figure 1:
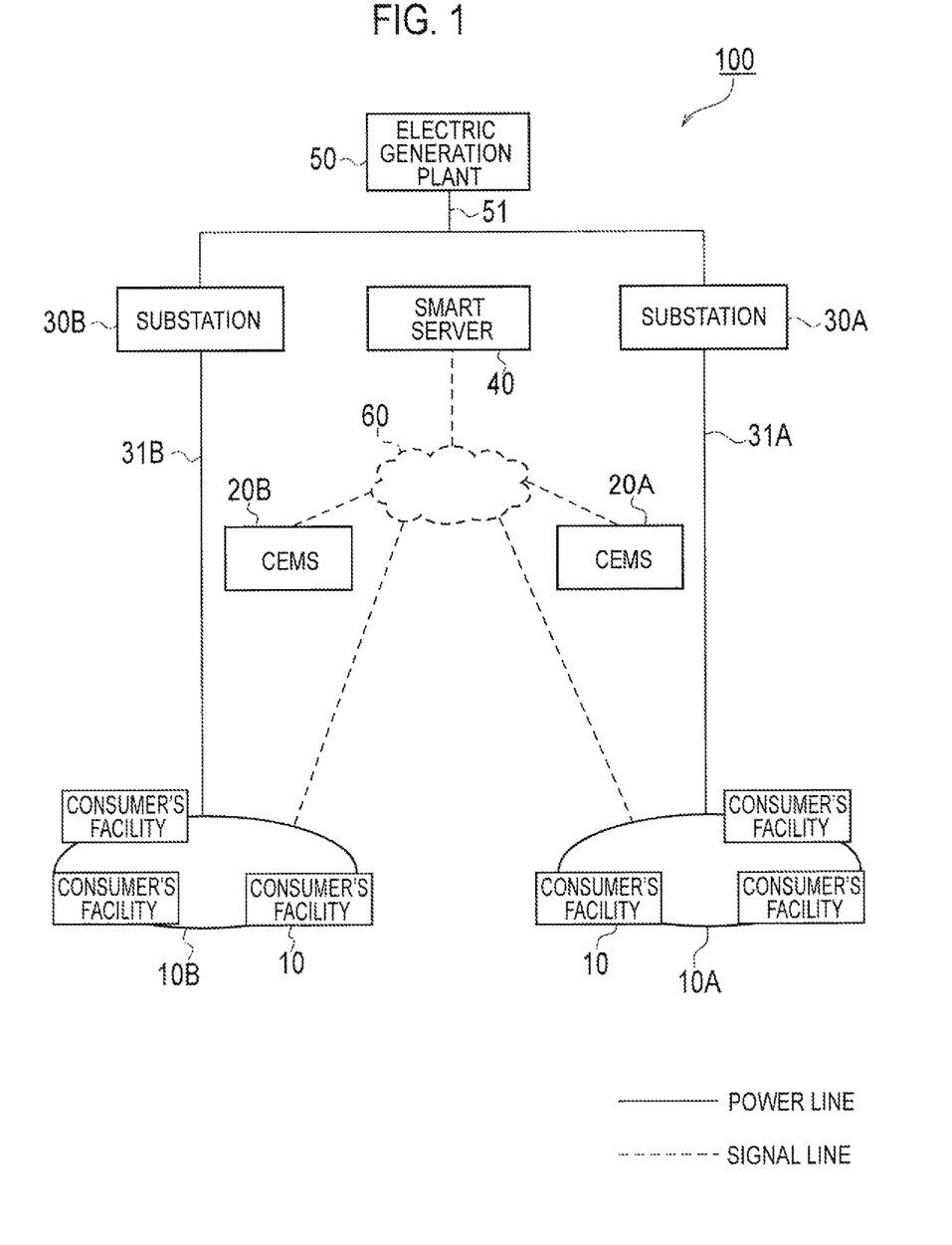
FIG. 1 is a diagram showing an energy management system 100 according to a first embodiment.

The energy management system according to the first embodiment will be described, below. FIG. 1 is a diagram showing an energy management system 100 according to the first embodiment.

As shown in FIG. 1, the energy management system 100 comprises a consumer's facility, a CEMS 20, a transformer station 30, a smart server 40, and an electric generation plant 50. It is noted that the consumer's facility, the CEMS 20, the transformer station 30, and the smart server 40 are connected by a network 60.

The consumer's facility 10 has a power generation apparatus and a power storage apparatus, for example. The power generation apparatus is an apparatus which uses fuel gas to output power such as a fuel cell, for example. The power storage apparatus such as a secondary battery is an apparatus in which power is stored.

The consumer's facility 10 may be a detached residence, a housing complex such as an apartment house. Or, the consumer's facility may be a shop such as a corner store or a supermarket. It is noted that the consumer's facility may be a business facility such as an office building or a factory.

In the first embodiment, a consumer's facility group 10A and a consumer's facility group 10B are configured by a plurality of the consumer's facilities 10. The consumer's facility group 10A and consumer's facility group 10B are classified into each geographical region, for example.

The CEMS 20 controls an interconnection between the plurality of consumer's facilities 10 and the power grid. It is noted that the CEMS 20 may be also called a CEMS (Cluster/Community Energy Management System), since the CEMS 20 manages the plurality of consumer's facilities 10. Specifically, the CEMS 20 disconnects the plurality of consumer's facilities 10 and the power grid at a power failure or the like. On the other hand, the CEMS 20 interconnects the plurality of consumer's facilities 10 to the power grid, for example, at restoration of power.

In the first embodiment, a CEMS 20A and a CEMS 20B are provided. The CEMS 20A controls an interconnection between the consumer's facilities 10 included in the consumer's facility group 10A and the power grid, for example. The CEMS 20B controls an interconnection between the consumer's facilities 10 included in the consumer's facility group 10B and the power grid, for example.

The transformer station 30 supplies power to the plurality of consumer's facilities 10 through a distribution line 31. Specifically, the transformer station 30 lowers the voltage supplied from the electric generation plant 50.

In the first embodiment, a transformer station 30A and a transformer station 30B are provided. The transformer station 30A supplies power to the consumer's facilities 10 included in the consumer's facility group 10A through a distribution line 31A, for example. The transformer station 30B supplies power to the consumer's facilities 10 included in the consumer's facility group 10B through a distribution line 31B, for example.

The smart server 40 manages a plurality of the CEMSs 20 (here, the CEMS 20A and CEMS 20B). Further, the smart server 40 manages a plurality of the transformer stations 30 (here, the transformer station 30A and the transformer station 30B). In other words, the smart server 40 integrally manages the consumer's facilities 10 included in the consumer's facility groups 10A and 10B. For example, the smart server 40 has a function of balancing the power to be supplied to the consumer's facility group 10A and the power to be supplied to the consumer's facility group 10B.

The electric generation plant 50 generates power by thermal power, solar power, wind power, water power, atomic power or the like. The electric generation plant 50 supplies power to the plurality of the transformer stations 30 (here, the transformer station 30A and the transformer station 30B) through an electric feeder line 51.

The network 60 is connected to each apparatus via a signal line. The network 60 is an Internet, a wide area network, a narrow area network, and a mobile phone network, for example.

(Consumer's Facility)

Figure 2:
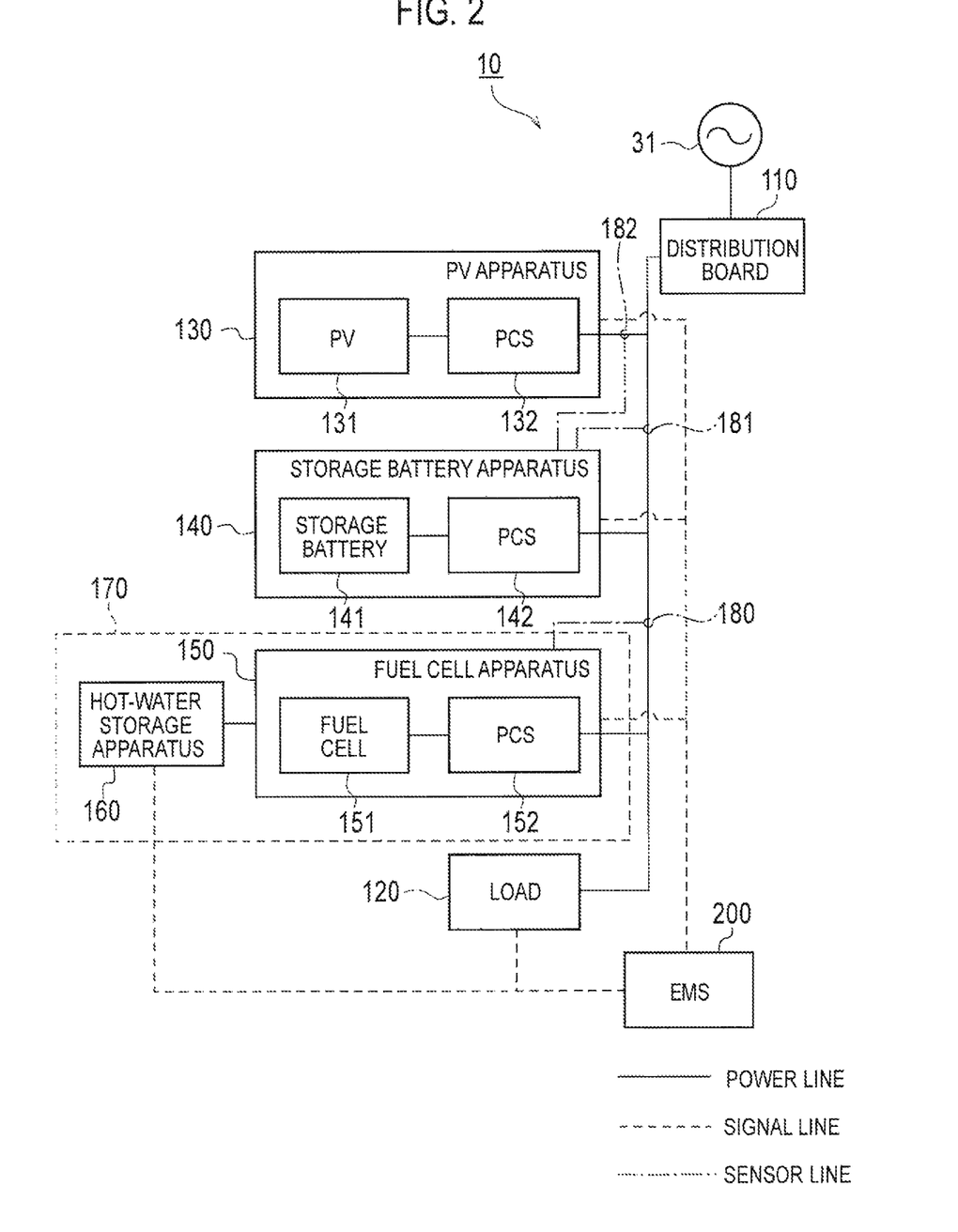
FIG. 2 is a diagram showing a consumer's facility 10 according to the first embodiment.

The consumer's facility according to the first embodiment will be described, below. FIG. 2 is a diagram showing the details of the consumer's facility according to the first embodiment.

As shown in FIG. 2, the consumer's facility comprises a distribution board 110, a load 120, a PV apparatus 130, a storage battery apparatus 140, a fuel cell apparatus 150, a hot-water storage apparatus 160, and an EMS 200.

In the first embodiment, a consumer's facility 10 comprises an ammeter 180, an ammeter 181, and an ammeter 182.

The ammeter 180 is used for the load following control on the fuel cell apparatus 150. The ammeter 180 is arranged downstream of a connection point between a storage battery apparatus 140 and a power line (the side away from the grid) and upstream of a connection point between the fuel cell apparatus 150 and the power line (the side closer to the grid), on the power line connecting each apparatus (for example, the storage battery apparatus 140 and the fuel cell apparatus 150) and the grid. It is natural that the ammeter 180 is arranged upstream (the side closer to the grid) of the connection point between the load 120 and the power line.

The ammeter 181 is used for checking the existence or non-existence of the flow of power from the storage battery apparatus 140 to the grid (reverse power flow). The ammeter 181 is arranged upstream of a connection point between the storage battery apparatus 140 and a power line (the side closer to the grid), on the power line connecting each equipment (for example, the storage battery apparatus 140) and the grid.

The ammeter 182 is used for measuring the power generated by the PV apparatus 130. The ammeter 182 is arranged on the side of the PV apparatus 130 from a connection point between a power line connecting each equipment (for example, the PV apparatus 130) and the grid, and the PV apparatus 130.

It must be noted that in the first embodiment, each equipment is connected to the power line in the short-distance order to the grid of the PV apparatus 130, the storage battery apparatus 140, the fuel cell apparatus 150, and the load 120. However, the fuel cell apparatus 150 and the storage battery apparatus 140 may be connected in the reverse order as well.

The distribution board 110 is connected to a distribution line 31 (a grid). The distribution board 110 is connected, via a power line, to the load 120, the PV apparatus 130, the storage battery apparatus 140, and the fuel cell apparatus 150.

The load 120 is an apparatus which consumes the power supplied via a power line. Examples of the load 120 comprise an apparatus such as a refrigerator, a freezer, a lighting, and an air conditioner.

The PV apparatus 130 comprises a PV 131 and a PCS 132. The PV 131 is an example of the power generation apparatus, and is a solar light power generation apparatus (Photovoltaic Device) which generates power in response to reception of solar light. The PV 131 outputs the generated DC power. The amount of power generated by the PV 131 varies depending on the amount of solar radiation entering the PV 131. The PCS 132 is an apparatus (Power Conditioning System) which converts the DC power output from the PV 131, into AC power. The PCS 132 outputs the AC power to the distribution board 110 via a power line.

In the first embodiment, the PV apparatus 130 may comprise a pyranometer which measures the solar radiation entering the PV 131.

The PV apparatus 130 is controlled by an MPPT (Maximum Power Point Tracking) method. In particular, the PV apparatus 130 optimizes an operation point (point determined by an operation-point voltage value and power value, or a point determined by an operation-point voltage value and current value) of the PV 131.

The storage battery apparatus 140 comprises a storage battery 141 and a PCS 142. The storage battery 141 is an apparatus which stores power. The PCS 142 is an apparatus (Power Conditioning System) which converts the AC power supplied from the distribution line 31 (grid), into DC power. Further, the PCS 142 converts the DC power output from the storage battery 141, into AC power.

The fuel cell apparatus 150 comprises a fuel cell 151 and a PCS 152. The fuel cell 151 is an example of a power generation apparatus, and an apparatus which generates power by using a fuel (gas). The PCS 152 is an apparatus (Power Conditioning System) which converts the DC power output from the fuel cell 151, into AC power.

The fuel cell apparatus 150 is operated by load following control. In particular, the fuel cell apparatus 150 controls the fuel cell 151 so that the power output from the fuel cell 151 reaches a target power of the load following control. In other words, the fuel cell apparatus 150 controls the power outputted from the fuel cell 151 such that a product of an electric current value detected by the ammeter 180 and a power value detected by the PCS 152 becomes a target received power.

The hot-water storage apparatus 160 is an apparatus which either generates hot water using fuel (gas), or maintains the water temperature. Specifically, the hot-water storage apparatus 160 comprises a hot-water storage tank where the water supplied from the hot-water storage tank is warmed by the heat generated by burning of fuel (gas) or the exhaust heat generated by drive (power generation) of the fuel cell 151. In particular, the hot-water storage apparatus 160 warms the water supplied from the hot-water storage tank and feeds the warmed water back to the hot-water storage tank.

It must be noted that in the embodiment, the fuel cell apparatus 150 and the hot-water storage apparatus 160 configure the hot-water supply unit 170 (the hot-water supply system).

The EMS 200 is an apparatus (Energy Management System) which controls the PV apparatus 130, the storage battery apparatus 140, the fuel cell apparatus 150, and the hot-water storage apparatus 160. Specifically, the EMS 200 is connected to the PV apparatus 130, the storage battery apparatus 140, the fuel cell apparatus 150, and the hot-water storage apparatus 160 via a signal line, and controls the PV apparatus 130, the storage battery apparatus 140, the fuel cell apparatus 150, and the hot-water storage apparatus 160. Further, the EMS 200 controls an operation mode of the load 120 to control the power consumption of the load 120.

Further, the EMS 200 is connected, via the network 60, to various types of servers. The various types of servers store information such as a purchase unit price of power supplied from a grid, a sales unit price of the power supplied from the grid, and a purchase unit price of fuel, for example (hereinafter, energy rate information).

Alternatively, various types of servers store information for predicting the power consumption of the load 120

(hereinafter, consumed-energy prediction information), for example. The consumed-energy prediction information may be generated on the basis of an actual value of the power consumption of the load 120 in the past, for example. Alternatively, the consumed-energy prediction information may be a model of the power consumption of the load 120.

Alternatively, various types of servers store information for predicting an amount of power generated by the PV 131 (hereinafter, PV-power-generation-amount prediction information), for example. The PV-power-generation prediction information may be a predicted value of a solar radiation entering the PV 131. Alternatively, the PV-power-generation prediction information may be a weather forecast, a season, and hours of sunlight, for example.

(Photovoltaic Cell Apparatus)

Figure 3:
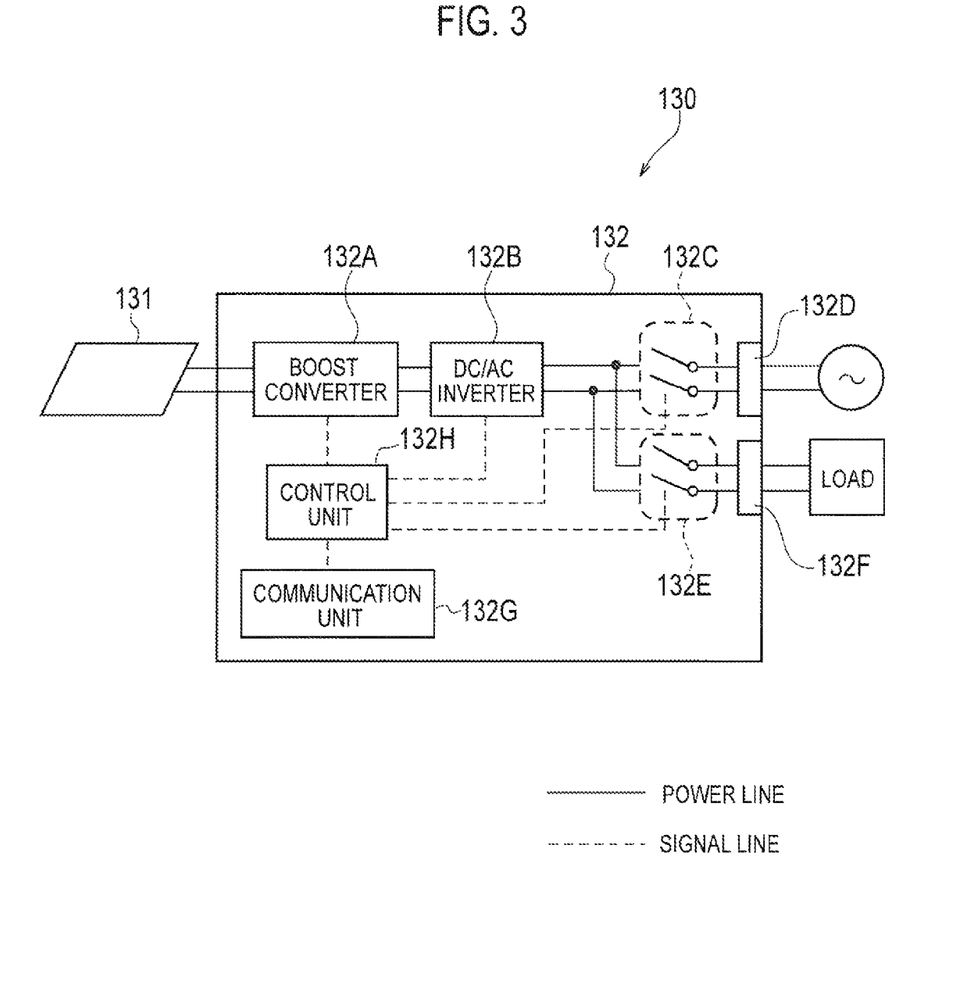
FIG. 3 is a diagram showing a PV apparatus 130 according to the first embodiment.

Hereinafter, a photovoltaic cell apparatus according to the first embodiment will be described. FIG. 3 is a diagram showing a PV apparatus 130 according to the first embodiment.

As shown in FIG. 3, the PV apparatus 130 comprises a PV 131 and a PCS 132. The PCS 132 comprises a boost converter 132A, a DC/AC inverter 132B, a grid relay 132C, a grid terminal 132D, a self-sustained relay 132E, a self-sustained terminal 132F, a communication unit 132G, and a control unit 132H.

The boost converter 132A boosts the power outputted from the PV 131 (DC power) through DC/DC conversion.

The DC/AC inverter 132B converts the power outputted from the boost converter 132A (DC power) to AC power through DC/AC conversion.

The grid relay 132C is a relay switch which switches the existence or non-existence of a connection between the DC/AC inverter 132B and the grid terminal 132D.

The grid terminal 132D is a terminal to connect the grid (or the equipments connected to the grid) and the PV apparatus 130.

The self-sustained relay 132E is a relay switch which switches the existence or non-existence of a connection between the DC/AC inverter 132B and the self-sustained terminal 132F.

The self-sustained terminal 132F is a terminal (plug) to connect a load which is not connected to the grid, and the PV apparatus 130.

The communication unit 132G communicates with the EMS 200, for example. In the first embodiment, the communication unit 132G configures a transmission unit which transmits various types of messages to the EMS 200. The communication unit 132G configures a reception unit which receives various types of messages from the EMS 200.

In the first embodiment, at least one of a message indicating the spec of the PV apparatus 130 and a message indicating a status of the PV apparatus 130 is standardized between the EMS 200 and the PV apparatus 130.

For example, the communication unit 132G transmits at least one of the message indicating the spec of the PV apparatus 130 and the message indicating the status of the PV apparatus 130, to the EMS 200. Alternatively, the communication unit 132G receives a message indicating the status of the PV apparatus 130 from the EMS 200.

The spec of the PV apparatus 130 comprises, for example, at least one of the rated power in a grid connection state in which the PCS 132 is connected to the grid (the state when the PCS 132 is connected to the grid terminal 132D), the rated power in a self-sustained operation state in which the PCS 132 is connected to the self-sustained terminal 132F, and the maximum output power of the PV 131 (a solar panel).

For example, in the grid connection state, since the PV apparatus 130 is connected to the grid, the output power of the PV apparatus 130 is controlled by the current control. The rated power in the grid connection state depends on the spec of the PCS 132, and is 4.5 kW, for example.

On the other hand, in the self-sustained operation state, since the PV apparatus 130 is not connected to the grid, the output power of the PV apparatus 130 is controlled by the voltage control. The rated power in the self-sustained operation state depends on the spec of the self-sustained relay 132E and the self-sustained terminal 132F, and is 1.5 kW, for example.

The maximum output power of the PV 131 (the solar panels) depends on the spec and the number of the solar panels, and is 4.0 kW (200 W×20 panels), for example. Here, the maximum output power of the PV 131 (the solar panels) may be entered manually, or may be estimated from the power generated in the past.

The status of the PV apparatus 130 comprises at least one of whether or not the PCS 132 is connected to the grid, and whether or not the PCS 132 is connected to the self-sustained terminal 132F. In other words, the status of the PV apparatus 130 comprises at least one of the grid relay 132C ON/OFF, and the self-sustained terminal 132F ON/OFF.

Here, the status of the PV apparatus 130 may comprise whether or not the supply of power from the PV apparatus 130 to the grid (the reverse power flow) is permitted.

In the first embodiment, before the communication of a message indicating the spec of the PV apparatus 130, a communication unit 132G transmits a message indicating the existence or non-existence of a function of handling the message indicating the spec of the PV apparatus 130. Alternatively, before the communication of a message indicating the status of the PV apparatus 130, the communication unit 132G transmits a message indicating the existence or non-existence of a function of handling the message indicating the status of the PV apparatus 130.

(Network Configuration)

Figure 4:
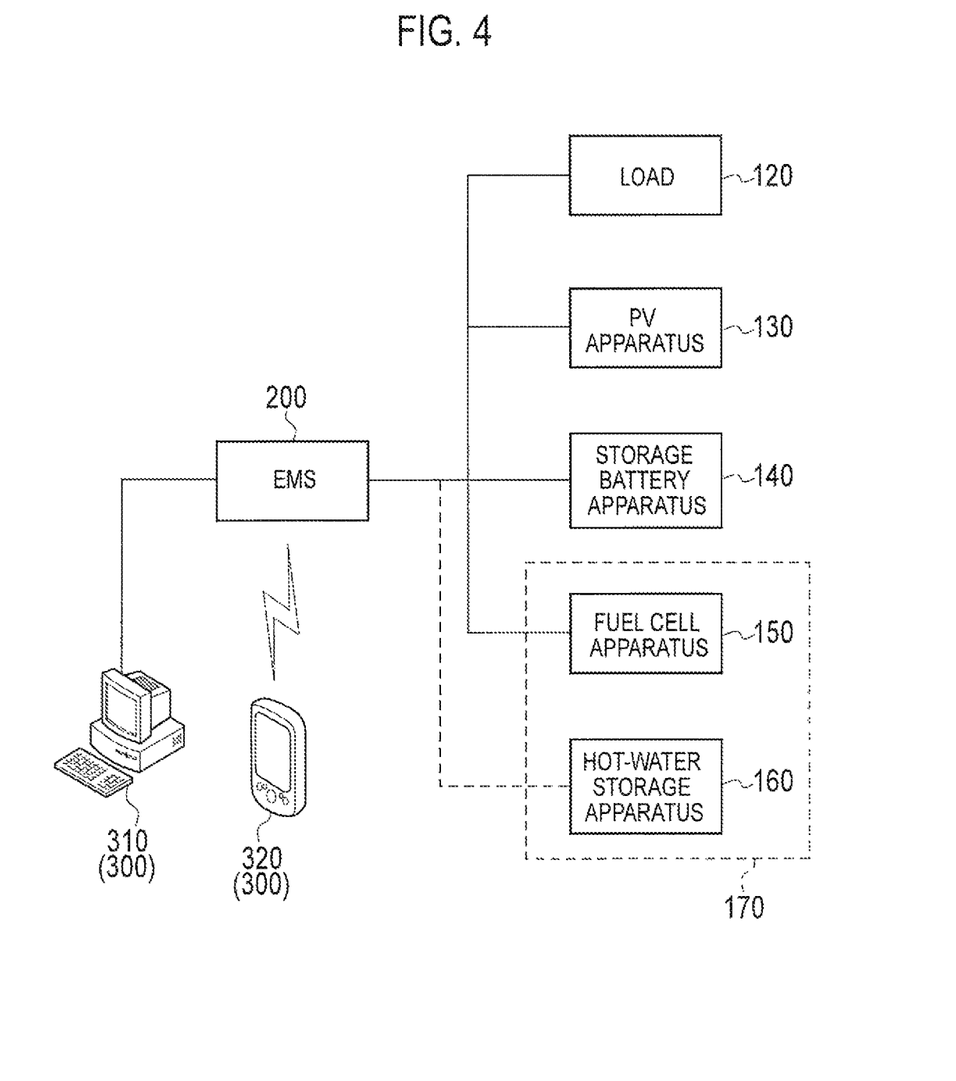
FIG. 4 is a diagram showing a network configuration according to the first embodiment.

Hereinafter, a network configuration according to the first embodiment will be described. FIG. 4 is a diagram showing a network configuration according to the first embodiment.

As shown in FIG. 4, the network is configured by the load 120, the PV apparatus 130, the storage battery apparatus 140, the fuel cell apparatus 150, the hot-water storage apparatus 160, the EMS 200, and the user terminal 300. The user terminal 300 comprises a user terminal 310 and a user terminal 320.

The user terminal 310 is connected to the EMS 200, and displays the information for visualization of energy consumption (hereinafter, the visualization information) of each equipment (the load 120, the PV apparatus 130, the storage battery apparatus 140, the fuel cell apparatus 150, and the hot-water storage apparatus 160) through a web browser. In such a case, the EMS 200 generates the visualization information in a format such as HTML, and transmits the generated visualization information to the user terminal 310. The connection type between the user terminal 310 and the EMS 200 may be wired or may be wireless.

The user terminal 320 is connected to the EMS 200, and displays the visualization information through an application. In such a case, the EMS 200 transmits the information showing the energy consumption of each equipment to the user terminal 320. The application of the user terminal 320 generates the visualization information on the basis of the information received from the EMS 200, and displays the generated visualization information. The connection type between the user terminal 320 and the EMS 200 may be wired or may be wireless.

As described above, in the first embodiment, the fuel cell apparatus 150 and the hot-water storage apparatus 160 configure the hot-water supply unit 170. Therefore, the hot-water storage apparatus 160 need not necessarily possess the function of communicating with the EMS 200. In such a case, the fuel cell apparatus 150 substitutes the hot-water storage apparatus 160 and communicates messages concerning the hot-water storage apparatus 160 with the EMS 200.

In the first embodiment, the communication between the EMS 200 and each equipment (the load 120, the PV apparatus 130, the storage battery apparatus 140, the fuel cell apparatus 150, and the hot-water storage apparatus 160) is performed by a method which is in accordance with a predetermined protocol. The predetermined protocol could be, for example, a protocol called the "ECHONET Lite" (registered trademark) and the "ECHONET" (registered trademark). However, the embodiment is not restricted to these protocols, and the predetermined protocol could also be a protocol other than the "ECHONET Lite" or the "ECHONET" (for example, ZigBee (registered trademark)).
(Configuration of EMS)

Figure 5:
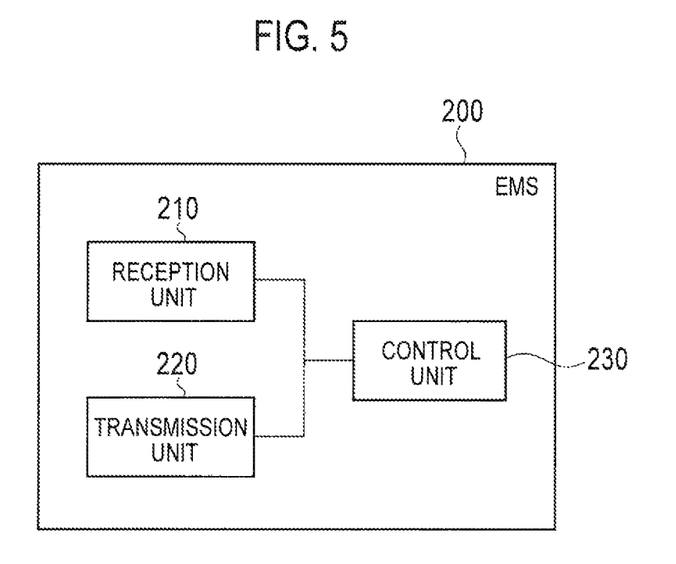
FIG. 5 is a diagram showing an EMS 200 according to the first embodiment.

Hereinafter, an EMS according to the first embodiment will be described. FIG. 5 is a block diagram showing an EMS 200 according to the first embodiment.

As shown in FIG. 5, the EMS 200 has a reception unit 210, a transmission unit 220, and a control unit 230.

The reception unit 210 receives various types of signals from an apparatus connected via a signal line. For example, the reception unit 210 may receive information indicating the amount of power generated by the PV 131, from the PV apparatus 130. The reception unit 210 may receive information indicating the amount of power to be stored in the storage battery 141, from the storage battery apparatus 140. The reception unit 210 may receive information indicating the amount of power generated by the fuel cell 151, from the fuel cell apparatus 150. The reception unit 210 may receive information indicating the amount of hot water to be stored in the hot-water storage apparatus 160, from the hot-water storage apparatus 160. The reception unit 210 with a transmission unit 220 described below configures a communication unit.

In the first embodiment, the reception unit 210 may receive energy charge information, energy consumption prediction information, and PV power-generation amount prediction information from the various types of servers via the network 60. However, the energy charge information, the energy consumption prediction information, and the PV power-generation amount prediction information may be stored in advance in the EMS 200.

In the first embodiment, the reception unit 210 receives at least one of a message indicating the spec of the PV apparatus 130 and a message indicating a status of the PV apparatus 130, from the PV apparatus 130. Thus, the reception unit 210 acquires the spec of the PV apparatus 130 or the status of the PV apparatus 130.

In the first embodiment, before the communication of the message indicating the spec of the PV apparatus 130, the reception unit 210 receives a message indicating the existence or non-existence of a function of handling the message indicating the spec of the PV apparatus 130, from the PV apparatus 130. Alternatively, before the communication of the message indicating the status of the PV apparatus 130, the reception unit 210 receives a message indicating the existence or non-existence of a function of handling the message indicating the status of the PV apparatus 130, from the PV apparatus 130.

The transmission unit 220 transmits various types of signals to an apparatus connected via signal lines. For example, the transmission unit 220 transmits a signal for controlling the PV apparatus 130, the storage battery apparatus 140, the fuel cell apparatus 150, and the hot-water storage apparatus 160, to each apparatus. The transmission unit 220 transmits a control signal for controlling the load 120, to the load 120.

In the first embodiment, the transmission unit 220 transmits the message indicating the status of the PV apparatus 130 to the PV apparatus 130. Thus, the transmission unit 220 instructs the status of the PV apparatus 130 to the PV apparatus 130. In detail, by transmitting a message indicating the self-sustained operation state when a power failure occurs, the transmission unit 220 controls the PV apparatus 130 so that the PV apparatus 130 is in the self-sustained operation state. Alternatively, by transmitting a message indicating the grid connection state when the grid restores from a power failure, the transmission unit 220 controls the PV apparatus 130 so that the PV apparatus 130 is in the grid connection state. Alternatively, the transmission unit 220 transmits the message requesting the spec of the PV apparatus 130 to the PV apparatus 130. Alternatively, the transmission unit 220 transmits a message requesting the status of the PV apparatus 130 to the PV apparatus 130.

In the first embodiment, before the communication of the message indicating the spec of the PV apparatus 130, the transmission unit 220 transmits a message requesting the message indicating the existence or non-existence of a function of handling the message indicating the spec of the PV apparatus 130, to the PV apparatus 130. Alternatively, before the communication of the message indicating the status of the PV apparatus 130, the transmission unit 220 transmits a message requesting the message indicating the existence or non-existence of a function of handling the message indicating the status of the PV apparatus 130, to the PV apparatus 130.

The control unit 230 controls the load 120, the PV apparatus 130, the storage battery apparatus 140, the fuel cell apparatus 150, and the hot-water storage apparatus 160.
(Message Format)

Figure 6:
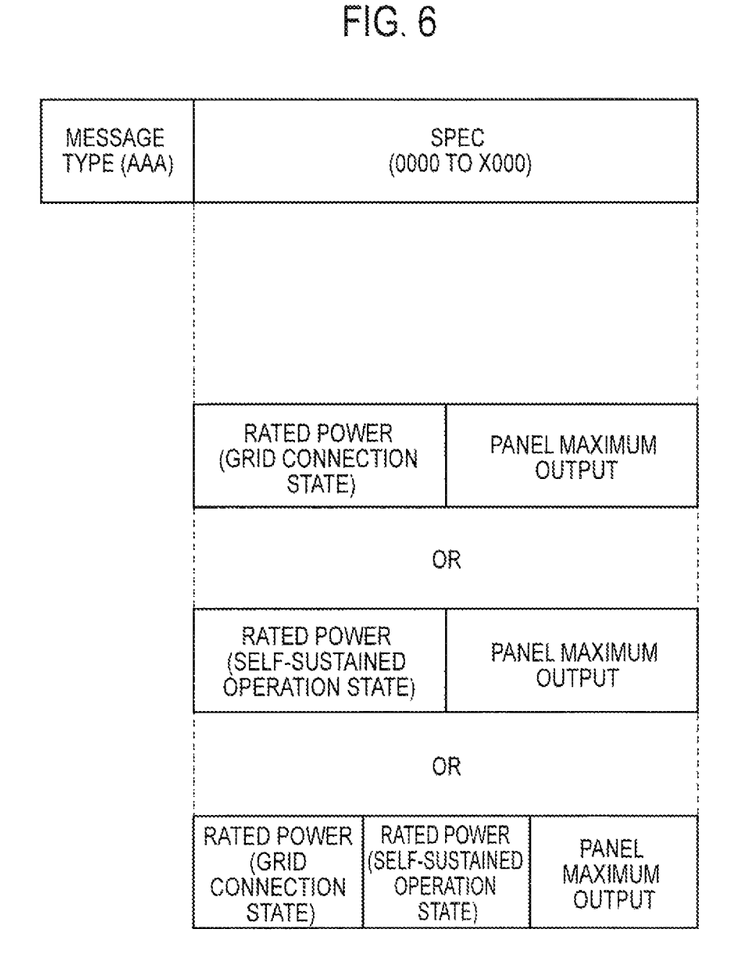
FIG. 6 is a diagram showing a message format according to the first embodiment.
Figure 7:
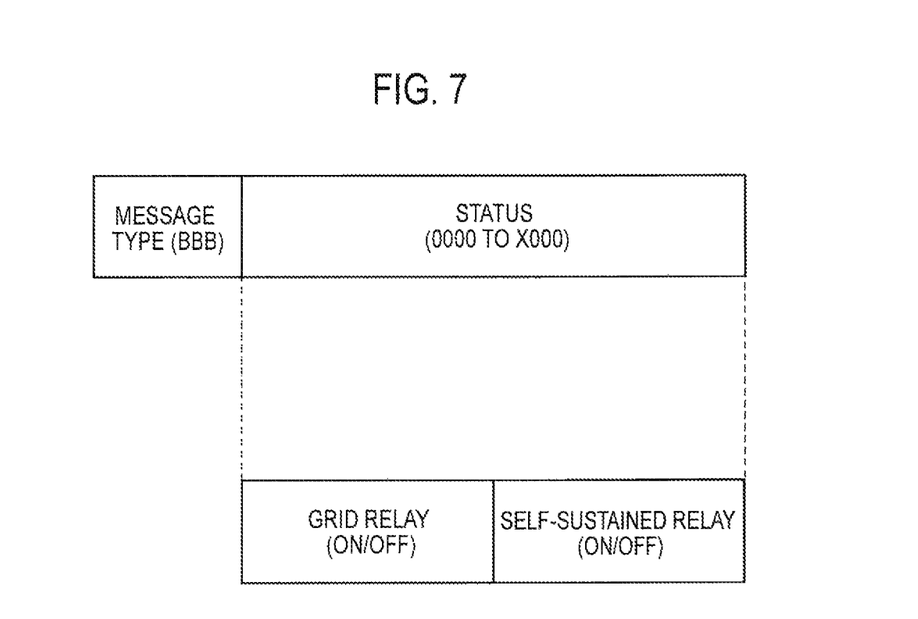
FIG. 7 is a diagram showing a message format according to the first embodiment.

Hereinafter, the message format according to the first embodiment will be described. FIG. 6 and FIG. 7 are diagrams showing an example of a message format according to the first embodiment.

Firstly, the message indicating the spec of the PV apparatus 130 has, for example, a format shown in FIG. 6. As shown in FIG. 6, the message comprises a field of the message type and a field of the spec.

The field of the message type indicates the type of the message, and in the first embodiment, it indicates that the message comprises spec.

The field of the spec indicates the spec of the PV apparatus 130. As described above, the spec of the PV apparatus 130 comprises at least one of the rated power in a grid connection state in which the PCS 132 is connected to the grid (the state when the PCS 132 is connected to the grid terminal 132D) (the grid connection state), the rated power in a self-sustained operation state in which the PCS 132 is connected to the self-sustained terminal 132F (the self-sustained operation state), and the maximum output power of the PV 131 (the solar panel) (the panel maximum output).

For example, as shown in FIG. 6, the field of the spec may comprise a combination of the rated power (the grid connection state) and the panel maximum output, or a combination of the rated power (the self-sustained operation state) and the panel maximum output, or a combination of the rated power (the grid connection state), the rated power (the self-sustained operation state), and the panel maximum output.

Secondly, the message indicating the status of the PV apparatus 130 has, for example, a format shown in FIG. 7. As shown in FIG. 7, the message comprises a field of the message type and a field of the status.

The field of the message type indicates the type of the message, and in the first embodiment, it indicates that the message comprises a status.

The field of the status indicates the status of the PV apparatus 130. The status of the PV apparatus 130 comprises at least one of whether or not the PCS 132 is connected to the grid, and whether or not the PCS 132 is connected to the self-sustained terminal 132F. In other words, the status of the PV apparatus 130 comprises at least one of the grid relay 132C ON/OFF, and the self-sustained terminal 132F ON/OFF. The status of the PV apparatus 130 may comprise whether or not the supply of power from the PV apparatus 130 to the grid (the reverse power flow) is permitted.

(Management Method)

Figure 8:
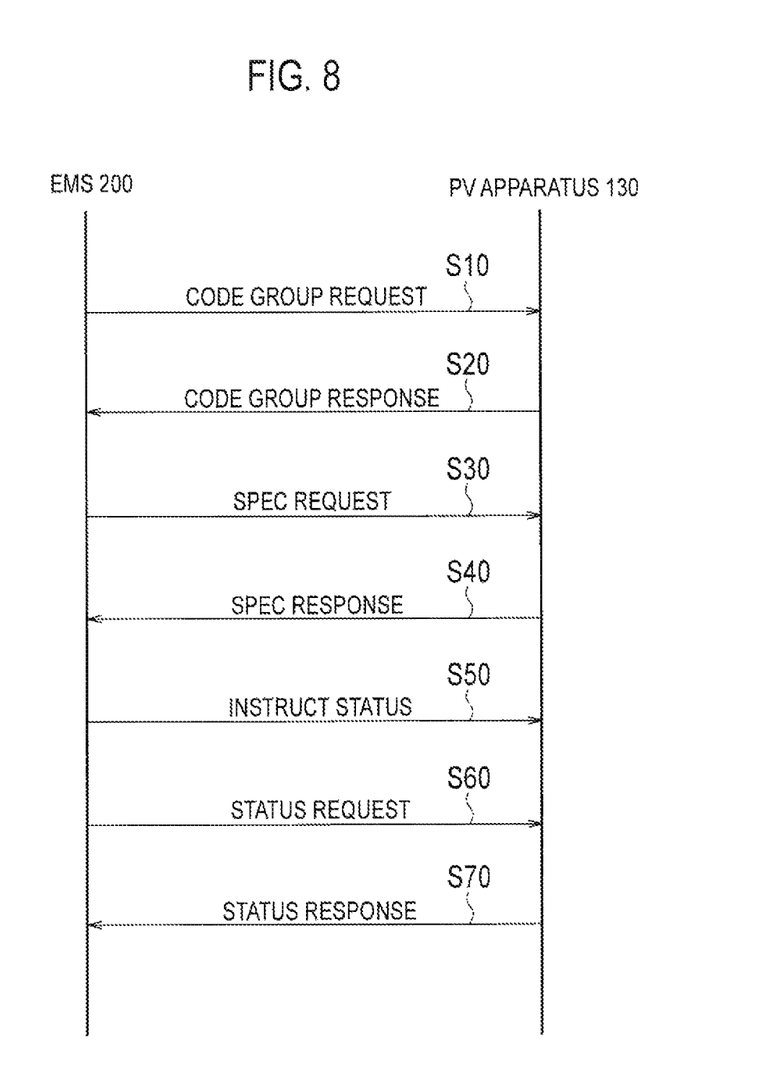
FIG. 8 is a sequence diagram showing a management method according to the first embodiment.

Hereinafter, the management method according to the first embodiment will be described. FIG. 8 is a sequence diagram showing a management method according to the first embodiment.

As shown in FIG. 8, in step S10, the EMS 200 transmits a message requesting a code group supported by the PV apparatus 130 (a code group request), to the PV apparatus 130. The code group request is an example of a message requesting the message indicating the existence or non-existence of a function of handling the message indicating the spec of the PV apparatus 130. Alternatively, the code group request is an example of a message requesting the message indicating the existence or non-existence of a function of handling the message indicating the status of the PV apparatus 130.

In step S20, the PV apparatus 130 transmits a message indicating the code group supported by the PV apparatus 130 (a code group response), to the EMS 200. The code group response is an example of a message indicating the existence or non-existence of a function of handling the message indicating the spec of the PV apparatus 130. Alternatively, the code group response is an example of a message indicating the existence or non-existence of a function of handling the message indicating the status of the PV apparatus 130.

In step S30, the EMS 200 transmits a message requesting the notification of the spec of the PV apparatus 130 (a spec request), to the PV apparatus 130.

In step S40, the PV apparatus 130 transmits a message indicating the spec of the PV apparatus 130 (a spec response), to the EMS 200.

In the step S50, the EMS 200 transmits the message indicating the status of the PV apparatus 130 to the PV apparatus 130. Thus, the EMS 200 instructs the status of the PV apparatus 130 to the PV apparatus 130.

For example, by transmitting a message indicating the self-sustained operation state when a power failure occurs, the EMS 200 controls the PV apparatus 130 so that the PV apparatus 130 is in the self-sustained operation state. Alternatively, by transmitting a message indicating the grid connection state when the grid restores from a power failure, the EMS 200 controls the PV apparatus 130 so that the PV apparatus 130 is in the grid connection state.

In step S60, the EMS 200 transmits a message requesting the notification of the status of the PV apparatus 130 (a status request), to the PV apparatus 130.

In step S70, the PV apparatus 130 transmits a message indicating the status of the PV apparatus 130 (a status response), to the EMS 200.

As described above, in the first embodiment, at least one of a message indicating the spec of the PV apparatus 130 and a message indicating a status of the PV apparatus 130 is standardized between the EMS 200 and the PV apparatus 130. Therefore, the PV apparatus 130 can be controlled appropriately by using these messages. Moreover, the other equipments (the load 120, the storage battery apparatus 140, and the fuel cell apparatus 150) can also be controlled appropriately by using these messages.

For example, since the rated power (the self-sustained operation state) and the panel maximum output are identified by the message indicating the spec of the PV apparatus 130, the EMS 200 can appropriately control the self-sustained operation state of the PV apparatus 130. Moreover, when the fact that the PV apparatus 130 is in the self-sustained operation state (the self-sustained relay 132E=ON) is notified by the message indicating the status of the PV apparatus 130, and the rated power (the self-sustained operation state) and panel maximum output are identified by the message indicating the spec of the PV apparatus 130, the EMS 200 can appropriately control the load connected to the storage battery apparatus 140, the fuel cell apparatus 150, and the self-sustained terminal 132F.

Similarly, since the rated power (the grid connection state) and the panel maximum output are identified by the message indicating the spec of the PV apparatus 130, the EMS 200 can appropriately control the grid connection state of the PV apparatus 130. Moreover, when the fact that the PV apparatus 130 is in the grid connection state (the grid relay 132C=ON) is notified by the message indicating the status of the PV apparatus 130, and the rated power (the self-sustained operation state) and panel maximum output are identified by the message indicating the spec of the PV apparatus 130, the EMS 200 can appropriately control the load connected to the storage battery apparatus 140, the fuel cell apparatus 150, and the grid terminal 132D.

Other Embodiments

Although the present invention has been described with reference to the embodiment described above, it should not be understood that the discussion and drawings constituting a part of the disclosure are limiting the present invention. Various alternative embodiments, examples and operation technology will be apparent to a person skilled in the art from the present disclosure.

The EMS 200 may be HEMS (Home Energy Management System), may be SEMS (Store Energy Management System), may be BEMS (Building Energy Management System), and may be FEMS (Factory Energy Management System).

In the embodiment, the consumer's facility 10 comprises the load 120, the PV apparatus 130, the storage battery apparatus 140, the fuel cell apparatus 150, and the hot-water storage apparatus 160. However, it may suffice that the consumer's facility 10 comprises at least the PV apparatus 130.

Particularly, it is preferable to perform transmission and reception of the code group request and the code group response at the timing of performing the initial settings of the PV apparatus 130, the timing of restoration from a power failure, the timing of turning ON the power supply of the PV apparatus 130, the timing of turning ON the power supply of the EMS 200, and the timing when it becomes necessary to check the settings of the PV apparatus 130.

Although not particularly mentioned in the embodiment, the PV apparatus 130 may autonomously transmit various types of messages to the EMS 200 rather than upon a request from the EMS 200. For example, the PV apparatus 130 transmits various types of messages to the EMS 200 when the predetermined conditions are fulfilled.

Although not particularly mentioned in the embodiment, the PV apparatus 130 may transmit a message indicating the spec of the PV apparatus 130 to the EMS 200, along with the code group response.

As described above, needless to say, the present invention comprises various embodiments and the like not described here. Moreover, it is also possible to combine the above-described embodiments and modifications. Therefore, the technical range of the present invention is to be standardized only by the inventive specific matter according to the adequate claims from the above description.

It is noted that the entire content of Japan Patent Application No. 2012-174459 (filed on Aug. 6, 2012) is incorporated in the present application by reference.

INDUSTRIAL APPLICABILITY

According to the present invention, it is possible to provide a management system, a management method, a control apparatus, and a photovoltaic cell apparatus capable of appropriately controlling equipments.

The invention claimed is:
1. A management system comprising:
a photovoltaic cell apparatus having a solar panel and a power conditioner which converts a power generated by the solar panel; and
a control apparatus configured to receive a message having a predetermined format from the photovoltaic cell apparatus in accordance with a predetermined protocol, wherein
the control apparatus receives a first message indicating a first rated power in a grid connection state in which the power conditioner is connected to a grid and a second message indicating a second rated power in a self-sustained operation state in which the power conditioner is not connected to the grid, in a state where the first rated power and the second rated power are distinguishable, the first message and the second message being transmitted from the photovoltaic cell apparatus to the control apparatus as the message having the predetermined format.
2. The management system according to claim 1, wherein the control apparatus receives, from the photovoltaic cell apparatus, a message indicating an existence or non-existence of a function of transmitting the first message and the second message, as the message having the predetermined format, before receiving the first message and the second message.
3. The management system according to claim 1, wherein the control apparatus configured to receive a message indicating a maximum output power of the solar panel as the message having the predetermined format.
4. The management system according to claim 1, wherein the control apparatus configured to receive a message indicating the power conditioner is connected to a power grid or the power conditioner is connected to a self-sustain terminal as the message having the predetermined format.
5. The management system according to claim 1, wherein the control apparatus configured to receive a message indicating the power conditioner is one of connected to a power grid and the power conditioner is connected to a self-sustain terminal as the message having the predetermined format.

* * * * *